United States Patent [19]

Yamashita et al.

[11] 4,093,820

[45] June 6, 1978

[54] ELECTRONIC ECHO GENERATION EQUIPMENT

[75] Inventors: Shigeru Yamashita, Takatsuki; Kazuo Masaki, Osaka; Masashi Shibahara, Kishiwada, all of Japan

[73] Assignee: Nihon Hammond Kabushiki Kaisha, Osaka, Japan

[21] Appl. No.: 814,748

[22] Filed: Jul. 11, 1977

[30] Foreign Application Priority Data

July 16, 1976 Japan ................................ 51-085240

[51] Int. Cl.$^2$ .......................... H04R 3/00; H03H 7/30

[52] U.S. Cl. ................................ 179/1 J; 307/221 C; 84/DIG. 26; 340/3 FM; 333/29; 179/1 P

[58] Field of Search .................... 179/1 J, 1 P; 328/55; 307/221 C, 221 D; 333/29, 23, 30 R; 343/17.2 PC; 84/DIG. 26, 1.25

[56] References Cited

U.S. PATENT DOCUMENTS

| | | | |
|---|---|---|---|
| 3,920,905 | 11/1975 | Sharp ................................ | 179/1 J |
| 3,980,828 | 9/1976 | Orban ................................ | 179/1 J |

*Primary Examiner*—Thomas W. Brown
*Assistant Examiner*—E. S. Kemeny
*Attorney, Agent, or Firm*—John J. McArdle, Jr.

[57] ABSTRACT

An electronic sound generation system wherein an input signal is frequency modulated, and the modulated signal passes through a series of cascaded shift registers. Amplifiers are provided for compensation of insertion loss in each shift register stage, and a frequency modulation detector is utilized to produce the time-delayed output echo signal.

5 Claims, 4 Drawing Figures

ELECTRONIC ECHO GENERATION EQUIPMENT

The invention is in the field of audio signal time delay systems.

More precisely, the presently described embodiment of the invention relates to a system for generating electronic echo sounds which is adapted to produce a sound of three-dimensional effect by sequentially electronically delaying a music sound signal of electronic or electric musical instruments and thereby converting the signal into an echo sound.

Figure 1:
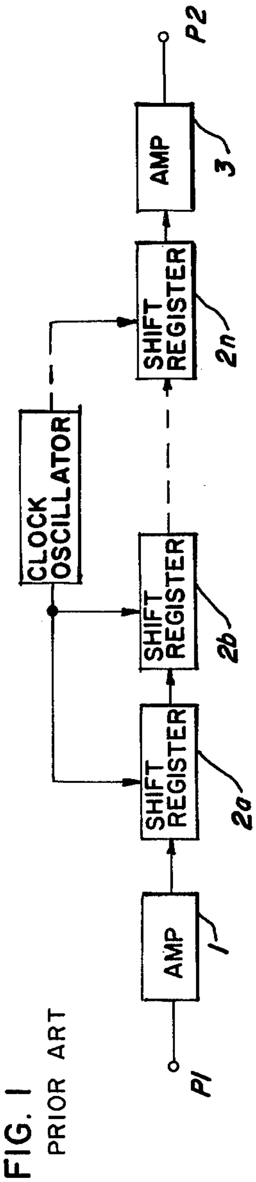
FIG. 1 PRIOR ART
FIG. 1 is a block diagram of a basic prior art echo generation delay path system.

It is generally known that delay elements are useful in providing systems of the type which produce echo sounds. Various delay elements are available, such as an element of the charge transfer type by which an input signal is transferred with use of a clock signal to delay the signal. This type of element is often referred to as a bucket brigade device (BBD) or an analog shift register. Because of its nature, the delay element, when incorporated into a circuit, will involve an insertion loss, so that if a multiplicity of such elements are used in cascade connection to prolong the delay time, the circuit has the drawback which shall be described below in regard to FIG. 1.

The input signal fed to an input terminal P1 is applied to an input amplifier 1 in which the signal is amplified to an operation level most suitable for charge transfer type elements, or analog shift registers, 2 subsequent to the amplifier 1. The first analog shift register *2a* gives a specified delay time t to the signal, and the signal is then fed to the second element *2b*. However, due to the insertion loss involved in the first element *2a*, the level of the signal applied to the second element *2b* is now lower by an amount corresponding to the insertion loss and is not at the optimum operation level. Thus, the signal level further progressively lowers from element to element. Consequently, if a multiplicity of the charge transfer type elements are used in cascade connection, the great overall insertion loss of all the elements will result in a signal level much lower than the optimum operation level, possibly rendering the signal no longer usable. Even if usable, the signal will then involve a poor signal to noise ratio and, when amplified by an amplifier 3, will give at an output terminal P2 an echo sound of poor quality.

Figure 2:
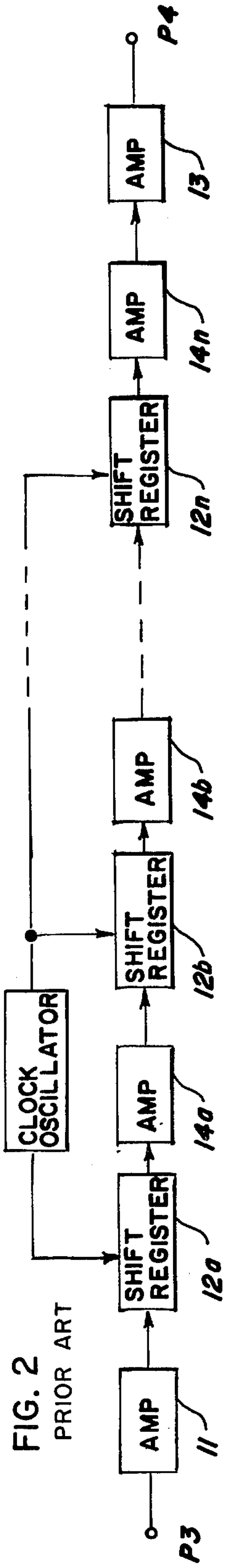
FIG. 2 PRIOR ART
FIG. 2 shows a slightly improved version of the FIG. 1 system.

In order to provide a desired prolonged delay time in the same manner as above but free of the drawback described, it would appear to be useful to dispose amplifiers 14 (FIG. 2) for compensating for the insertion loss of each shift register 12, the respective amplifier being connected to the output of each of the charge transfer type elements, or shift registers, which are arranged in cascade connection. In this case, the output signal fed to an input terminal P3 is amplified by an input amplifier 11 to a level optimum for the operation of the elements 12 and is then applied to the first element *12a* of the charge transfer type in which it is given a predetermined delay time *t*.

The insertion loss occurring in the first element *12a* is compensated for by the compensation amplifier *14a*, which is connected to the element *12a* and which amplifies the signal to a degree corresponding to the insertion loss, whereupon the signal is impressed on the second element *12b*. Even in this case, however, the noise produced in the first element *12a and in the compensation amplifier 14a* is amplified and then fed to the following element *12b*, with the result that with an increase in the number of the elements 12 used, the noise increases due to the addition of the noise occurring in each combination of the element 12 and the amplifier 14. Accordingly, despite the compensation of the insertion loss, the signal will have a reduced quality and deteriorated signal to noise ratio, and the echo sound appearing at output terminal P4 through amplifier 13 is in need of improvement.

The presently disclosed embodiment of the invention provides a system for generating electronic echo sounds effectively free of the foregoing drawbacks by delaying an input signal, the system being adapted to use the input signal in the form of a frequency-modulated wave amenable to noise suppression and a carrier signal for the frequency-modulated input wave. The basic structure of the present system is described below with reference to FIG. 3.

Figure 3:
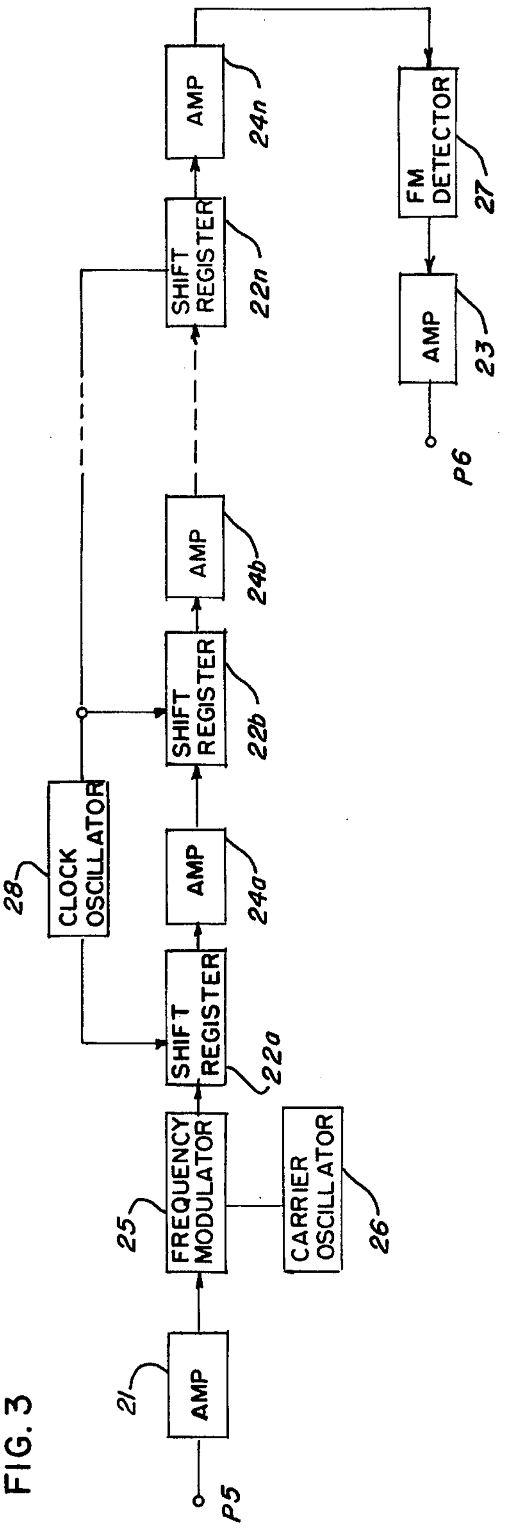
FIG. 3 is a block diagram of the basic structure of the presently disclosed embodiment of the inventive echo generation system delay path.

FIG 3 shows an input terminal P5, an amplifier 21 for amplifying an input signal to a modulation level, a frequency modulator 25, a carrier oscillator 26, and a multiplicity of elements 22 of the charge transfer, or analog shift register, type arranged in cascade connection, with compensation amplifiers 24 interposed therebetween. The compensation amplifiers are operative to compensate for the insertion losses involved in the charge transfer-type elements 22. Indicated at 27 is an FM detector, and at 28 a clock oscillator connected to the elements 22 and adapted to transfer the input signal. At 23, there is shown an amplifier and at P6 the output terminal.

The input signal impressed on the input terminal P5 is amplified to a proper modulation level by the amplifier 21 and modulated by the carrier oscillator 26 and frequency modulator 25. The frequency modulated signal is fed to the first element *22a* of the charge transfer type. Since the signal is a frequency-modulated wave, the signal can be set an at optimum operation level within the dynamic range determined by the element *22a*. The insertion loss occurring in the first element *22a* is compensated for by the compensation amplifier *24a*, and the resulting signal is fed to the second element *22b*. In this way, the signal is passed through the elements *22c* through *22n* in cascade connection, whereby the signal is given a specified delay time. The modulated signal is then applied to the frequency modulation detector 27 and amplified to an output level by the amplifier 23. The signal is thereafter emitted from the output terminal P6 as converted to an echo sound.

Figure 4:
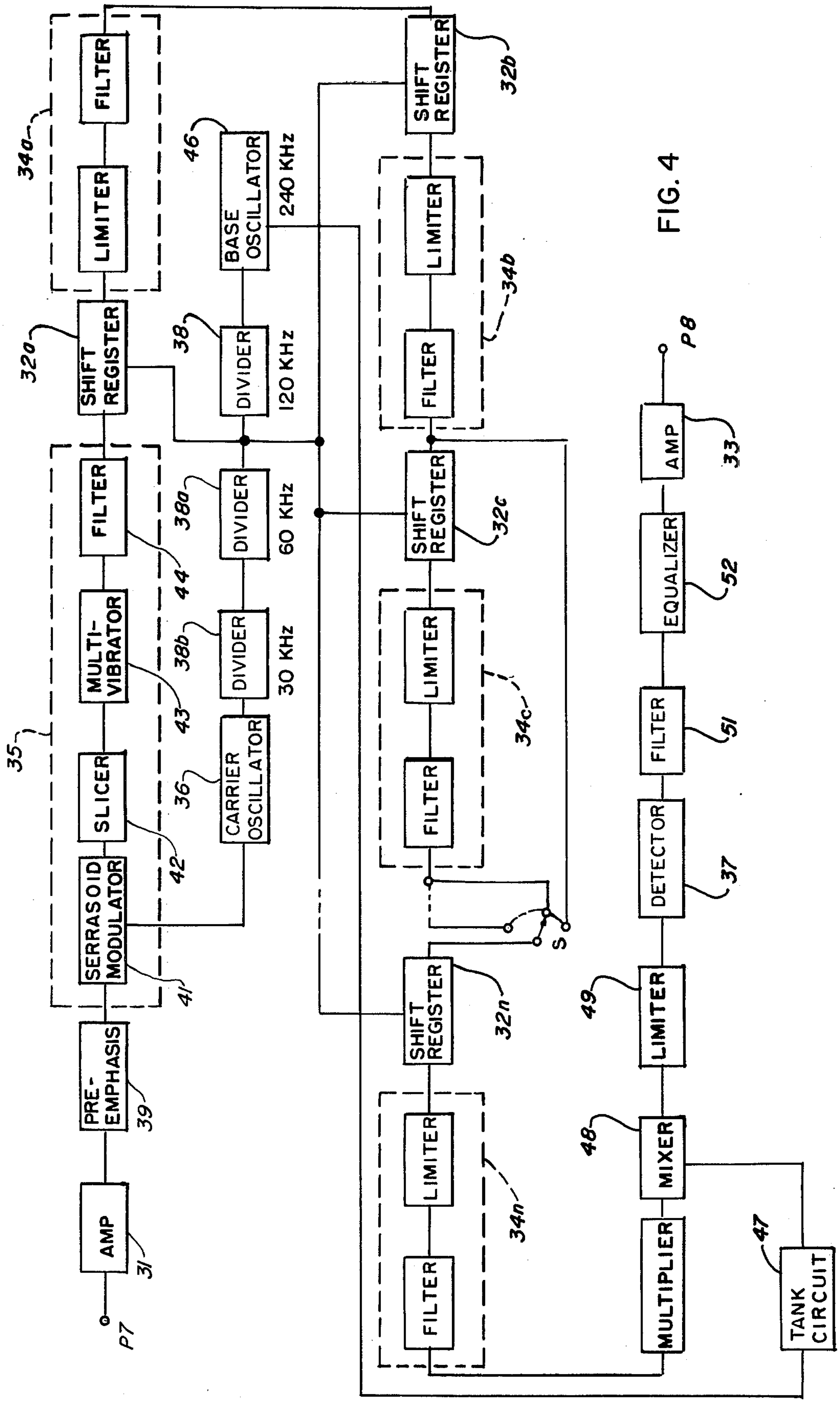
FIG. 4 is a more detailed block diagram of the system of FIG. 3.

A more detailed showing of the embodiment of the invention is described below with reference to FIG. 4.

An input signal applied to an input terminal P7 is amplified by a preamplifier 31 to a suitable modulation level for serrasoid modulation, improved in signal to noise ratio by pre-emphasis means 39 and then fed to a frequency modulator 35 comprising a serrasoid modulator 41, a slicer 42, a monostable multivibrator 43, and a band pass filter 44.

The signal from the pre-emphasis means 39 is converted by the serrasoid modulator 41 to a serrasoid-modulated wave, which is passed through the slicer 42 and the monostable multivibrator 43 and is thereby converted to a pulse-width modulated wave (PWM). The modulated wave is further converted by the band pass filter 44 to a frequency-modulated wave.

The output of frequency modulator 35 is fed to an element 32*a* of the charge transfer type.

The output squave wave from base oscillator 46 is frequency-divided by 8 by frequency dividers 38, 38*a* and 38*b*, and the resulting square wave is fed to a carrier oscillator 36, giving a sawtooth wave which is used as a carrier signal.

The signal input to the element 32*a* is transferred with the clock frequency of the frequency divider 38. The noise generated in the element 32*a* is eliminated by the limiter and band pass filter of an amplifier 34*a* for the compensation of insertion loss. The signal subsequently is fed to the next element 32*b* of the charge transfer, or analog shift register, type 32 and is further delayed by the element 32*b* and coupled to the following compensation amplifier 34*b*. In this way, the signal is given a delay time *t* which is dependent upon the clock frequency applied to the elements 32 from divider 38 and the transfer factor, the combination of the plurality of elements 32 thus giving the specified delay time.

The above embodiment resorts to serrasoid modulation which is excellent in characteristics such as signal to noise ratio, distortion factor, dynamic range, etc., but which however is somewhat disadvantageous in respect to modulation angle. Accordingly, the signal passing through the multiplicity of elements 32*a* through 32*n* in cascade connection is fed to a multiplier in which it is multiplied by nine to ensure satisfactory modulation index. However, the noise involved in the modulation step will be similarly multiplied by nine. Therefore, the output from the multiplier and the output of the base oscillator, as converted to a sine wave by being passed through a tank circuit 47, are applied to a mixer 48 and thereby beaten down.

The output of the mixer 48 is impressed upon a detector 37 by way of a limiter 49 for stabilizing the operation of the detector 37. The output of the detector 37 is passed through a low pass filter 51 for attenuating unnecessary signals and is thereafter fed to an equalizer 52 for the reverse compensation of the pre-emphasis. The output of equalizer 52 is amplified by an output amplifier 33 and emitted from an output terminal P8 as an echo sound.

The output from the detector 37 is relatively noise-free in that the noise produced in the modulation step has been beaten down in the mixer and limited by the limiter. Filter 51, of course, eliminates noise outside its pass band and fully attenuates the carrier (30 khz), giving a signal having a high signal to noise ratio. The multiplication by nine also ensures a satisfactory modulation index, affording a fully improved signal to noise ratio.

A delay time change-over switch S is shiftable to a desired position for delay time setting to give a desired delay time.

Although the system of this embodiment of the invention includes a multiplicity of charge transfer type elements which are arranged in cascade connection, the noise produced in the signal circuit does not degrade the signal fed to the input terminal, but the frequency modulation noise occurring in the signal path only is detected as a noise after the detection. Consequently, the present system gives a greatly improved signal to noise ratio as compared with the conventional systems, effectively generating echo sounds.

what is claimed is:

1. An electronic echo sound generation system having a direct path and a delay path, the delay path comprising:

- frequency modulation means for frequency modulating an input audio signal on a carrier and having an output;
- a plurality of analog shift registers operable to time delay the modulated signal, coupled in series at a first end from the output of the frequency modulation means;
- amplifier means coupled in series with the analog shift registers for compensating for the insertion losses of the analog shift registers; and
- frequency modulation detector means coupled from the second end of the series coupled analog shift registers for producing at an output an echo audio signal derived from the input audio signal.

2. The system of claim 1 in which said amplifier means comprises an insertion loss compensation amplifier coupled between each pair of intercoupled analog shift registers of the plurality of analog shift registers.

3. The system of claim 1 in which the frequency modulation means comprises a serrasoid modulator.

4. The system of claim 3 in which the amplifier means comprises a limiter and a filter.

5. The system of claim 2 in which the frequency modulation means comprises a serrasoid modulator and in which each said insertion loss compensation amplifier includes a limiter and a filter.

* * * * *